United States Patent
Ngu et al.

(10) Patent No.: US 12,328,078 B1
(45) Date of Patent: Jun. 10, 2025

(54) HYBRID SWITCH MULTI-CHIP POWER MODULE FOR A VEHICLE BATTERY

(71) Applicant: GM GLOBAL TECHNOLOGY OPERATIONS LLC, Detroit, MI (US)

(72) Inventors: Benjamin S. Ngu, Royal Oak, MI (US); Brian A. Welchko, Oakland Township, MI (US); Chandra S. Namuduri, Troy, MI (US); Yilun Luo, Ann Arbor, MI (US); Ioan Suciu, Windsor (CA); Eric B. Gach, Clarkston, MI (US); Rashmi Prasad, Troy, MI (US); Luciano N. Di Perna, Troy, MI (US); Khorshed Mohammed Alam, Canton, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 18/602,368

(22) Filed: Mar. 12, 2024

(51) Int. Cl.
*H02M 7/00* (2006.01)
*H01L 23/498* (2006.01)
*H01L 25/18* (2023.01)
*H02M 7/537* (2006.01)

(52) U.S. Cl.
CPC ....... *H02M 7/003* (2013.01); *H01L 23/49811* (2013.01); *H01L 25/18* (2013.01); *H02M 7/537* (2013.01)

(58) Field of Classification Search
CPC ......... H01L 23/49822; H01L 23/49811; H01L 23/49833
See application file for complete search history.

(56) References Cited

U.S. PATENT DOCUMENTS

| | | | |
|---|---|---|---|
| 2019/0051648 A1* | 2/2019 | Kakimoto | H10D 84/143 |
| 2019/0229644 A1* | 7/2019 | Miyake | H02M 1/088 |
| 2022/0095493 A1* | 3/2022 | Blanchard St-Jacques | H05K 1/0231 |

* cited by examiner

*Primary Examiner* — Jared Fureman
*Assistant Examiner* — Esayas G Yeshaw
(74) *Attorney, Agent, or Firm* — Quinn IP Law

(57) ABSTRACT

A system and method for receiving, at a multi-chip power module, multiple electronic control signals by one or more semiconductor devices of a first device type configured in parallel to one or more semiconductor devices of a second device type. The one or more semiconductor devices of the first device type and the one or more semiconductor devices of the second device type form a plurality of functional switches. The functional switches independently change states, in response to the plurality of electronic control signals. The one or more semiconductor devices of the first device type are configured to be electrically controlled for use independently and de-coupled, or in parallel, with the one or more semiconductor devices of the second device type.

20 Claims, 12 Drawing Sheets

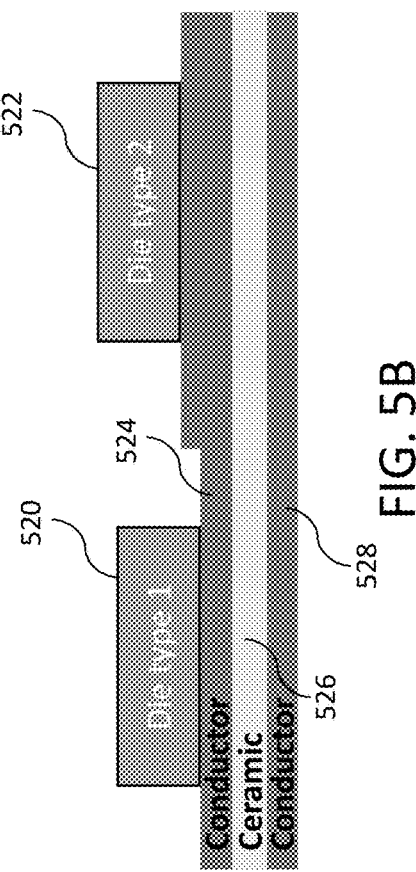
FIG. 5A
FIG. 5B
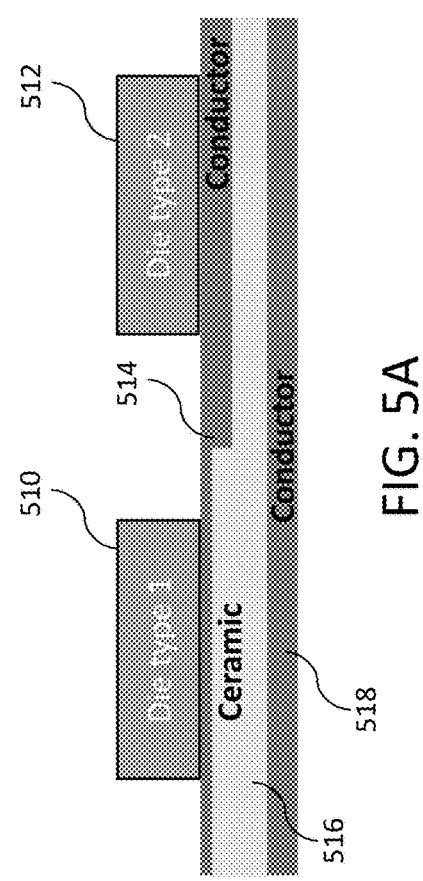
FIG. 5C
FIG. 5D

HYBRID SWITCH MULTI-CHIP POWER MODULE FOR A VEHICLE BATTERY

INTRODUCTION

Vehicles are rapidly integrating ever increasing technological components into their systems, especially in the direction of hybrid electric and battery based electric vehicles (EVs). EVs are becoming increasingly popular as an environmentally friendly alternative to traditional gasoline-powered vehicles. However, one of the challenges associated with EVs is the need for efficient, reliable, and manufacturable battery systems.

In the context of electric vehicles, an inverter may be used to convert a direct current (DC) supply from a vehicle's batteries into an alternating current (AC) that may be used to power electric motors that drive the vehicle. Further, based on the required current that the motors require for a particular driving scenario, e.g., acceleration or speed, a particular type of power module within an inverter may be more efficient at a lower current draw versus a higher current draw, where another type of power module within the inverter may be more efficient at a higher current draw versus a lower current draw.

SUMMARY

Disclosed herein are a system and method for controlling a power inverter in a vehicle. A power inverter in a vehicle may include a single multi-chip power module with one or more semiconductor devices of a first device type and one or more semiconductor devices of a second device type. The one or more semiconductor devices of the first device type and the one or more semiconductor devices of the second device type may be aligned in parallel. In addition, the one or more semiconductor devices of the first device type and the one or more semiconductor devices of the second device type may form multiple functional switches, in which each of the functional switches may be under independent electrical control. The one or more semiconductor devices of the first device type may also be electrically controlled for use independently and de-coupled, or in parallel, with the one or more semiconductor devices of the second device type.

Another aspect of the system may include the first device type having a silicon type device, and the second device type includes a wide bandgap (WBG) device.

Another aspect of the system may include the one or more semiconductor devices of the first device type and the one or more semiconductor devices of the second device type having a half-bridge configuration.

Another aspect of the system may include the half-bridge configuration having two or four independent semiconductor functional switches.

Another aspect of the system may include the one or more semiconductor devices of the first device type and the one or more semiconductor devices of the second device type having a six-pack module configuration.

Another aspect of the system may include the six-pack module configuration having six or twelve independent semiconductor functional switches.

Another aspect of the system may include the silicon type device having a silicon (Si) metal-oxide-semiconductor field-effect transistor (MOSFET), an insulated-gate bipolar transistor (IGBT), or a reverse-current IGBT (RC-IGBT).

Another aspect of the system may include the WBG device having a silicon carbide (SiC) metal-oxide-semiconductor field-effect transistor (MOSFET), an insulated-gate bipolar transistor (IGBT), a reverse-current IGBT, or a gallium nitride semiconductor.

Another aspect of the system may include each of the plurality of functional switches under independent control being driven by a pulse width modulated signal.

Another aspect of the system may further include two independent separate gate collector/drain, emitter/source pins for the first device type and two independent separate gate collector/drain, emitter/source pins for the second device type.

Another aspect of the system may include the two independent separate gate collector/drain, emitter/source pins for the first device type having a first applied voltage and current that is different from a second applied voltage and current to the two independent separate gate collector/drain, emitter/source pins for the second device type.

Another aspect of the system may include the first device type and the second device type being formed on a same power module substrate.

Another aspect of the disclosure may include a method for controlling a power inverter in a vehicle. The method may include receiving, at a multi-chip power module, a multiple set of electronic control signals, where the multi-chip power module may include one or more semiconductor devices of a first device type that may be aligned in parallel with one or more semiconductor devices of a second device type. In addition, the one or more semiconductor devices of the first device type and the one or more semiconductor devices of the second device type may form a plurality of functional switches. The method may also include switching, in response to the multiple set of electronic control signals, independently, a state of one or more of the plurality of functional switches, where the one or more semiconductor devices of the first device type may be electrically controlled for use independently and de-coupled, or in parallel and synchronously, with the one or more semiconductor devices of the second device type.

Another aspect of the method may include the first device type having a silicon type device, and the second device type includes a wide bandgap (WBG) device.

Another aspect of the method may include the one or more semiconductor devices of the first device type and the one or more semiconductor devices of the second device type having a half-bridge configuration.

Another aspect of the method may include the multiple set of electronic control signals having one or more pulse width modulated signals.

Another aspect of the method may include the first device type further having two independent separate gate collector/drain, emitter/source pins and the second device type further includes two independent separate gate collector/drain, emitter/source pins.

Another aspect of the method may include applying a first voltage and current to the two independent separate gate emitter/source pins for the first device type and applying a second voltage and current to the two independent separate gate emitter/source pins for the second device type.

Another aspect of the method may include forming the first device type and the second device type on a same power module substrate.

Another aspect of the disclosure may include a system for controlling a power inverter in a vehicle that includes a single multi-chip power module. The single multi-chip power module may include one or more semiconductor devices of a first device type where the first device type may include a silicon type device where the silicon type device may further include a silicon (Si) metal-oxide-semiconductor field-effect transistor (MOSFET), an insulated-gate bipolar transistor (IGBT), a reverse-current IGBT, or a junction field effect transistor (JFET). The system may also include one or more semiconductor devices of a second device type where the second device type may include a wide bandgap (WBG) device where the WBG device may include a silicon carbide (SiC) metal-oxide-semiconductor field-effect transistor (MOSFET), an insulated-gate bipolar transistor (IGBT), a reverse-current IGBT, a JFET, or a gallium nitride semiconductor. The system may also include two independent separate gate collector/drain, emitter/source pins for the first device type and two independent separate gate collector/drain, emitter/source pins for the second device type, where the two independent separate gate collector/drain, emitter/source pins for the first device type are may have a first applied voltage that is different from a second applied voltage to the two independent separate gate collector/drain, emitter/source pins for the second device type. Further, the one or more semiconductor devices of the first device type and the one or more semiconductor devices of the second device type may be aligned in parallel where the one or more semiconductor devices of the first device type and the one or more semiconductor devices of the second device type are may form a plurality of functional switches, in which each of the plurality of functional switches are under independent electrical control. In addition, the one or more semiconductor devices of the first device type may be electrically controlled for use independently and de-coupled, or in parallel and synchronously, with the one or more semiconductor devices of the second device type. The system may also include where the first device type and the second device type are formed on a same power module substrate.

The above features and advantages, and other features and attendant advantages of this disclosure, will be readily apparent from the following detailed description of illustrative examples and modes for carrying out the present disclosure when taken in connection with the accompanying drawings and the appended claims. Moreover, this disclosure expressly includes combinations and sub-combinations of the elements and features presented above and below.

BRIEF DESCRIPTION OF THE DRAWINGS

The accompanying drawings, which are incorporated into and constitute a part of this specification, illustrate implementations of the disclosure and together with the description, serve to explain the principles of the disclosure.

FIGS. 5A, 5B, 5C, and 5D illustrate various power module substrate designs with non-uniform layers, in accordance with the disclosure.

Figure 1:
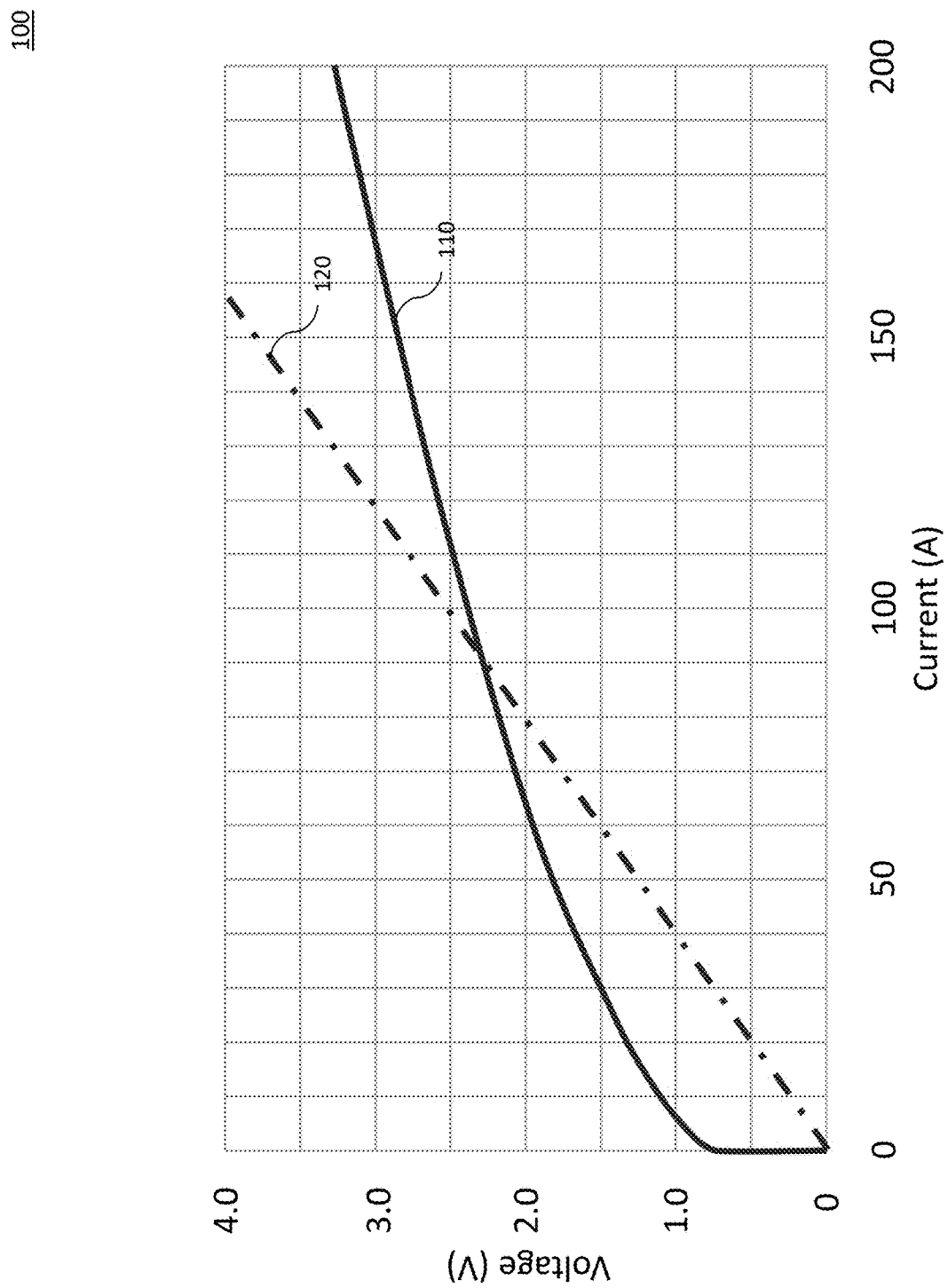
FIG. 1 is a graphical representation of on-state voltage and current loss characteristics in a vehicle inverter, in accordance with the disclosure.

The appended drawings are not necessarily to scale and may present a somewhat simplified representation of various preferred features of the present disclosure as disclosed herein, including, for example, specific dimensions, orientations, locations, and shapes. Details associated with such features will be determined in part by the particular intended application and use environment.

DETAILED DESCRIPTION

The present disclosure is susceptible of embodiment in many different forms. Representative examples of the disclosure are shown in the drawings and described herein in detail as non-limiting examples of the disclosed principles. To that end, elements and limitations described in the Abstract, Introduction, Summary, and Detailed Description sections, but not explicitly set forth in the claims, should not be incorporated into the claims, singly or collectively, by implication, inference, or otherwise.

For purposes of the present description, unless specifically disclaimed, use of the singular includes the plural and vice versa, the terms "and" and "or" shall be both conjunctive and disjunctive, and the words "including", "containing", "comprising", "having", and the like shall mean "including without limitation". Moreover, words of approximation such as "about", "almost", "substantially", "generally", "approximately", etc., may be used herein in the sense of "at, near, or nearly at", or "within 0-5% of", or "within acceptable manufacturing tolerances", or logical combinations thereof. As used herein, a component that is "configured to" perform a specified function is capable of performing the specified function without alteration, rather than merely having potential to perform the specified function after further modification. In other words, the described hardware, when expressly configured to perform the specified function, is specifically selected, created, implemented, utilized, programmed, and/or designed for the purpose of performing the specified function.

Figure 3:
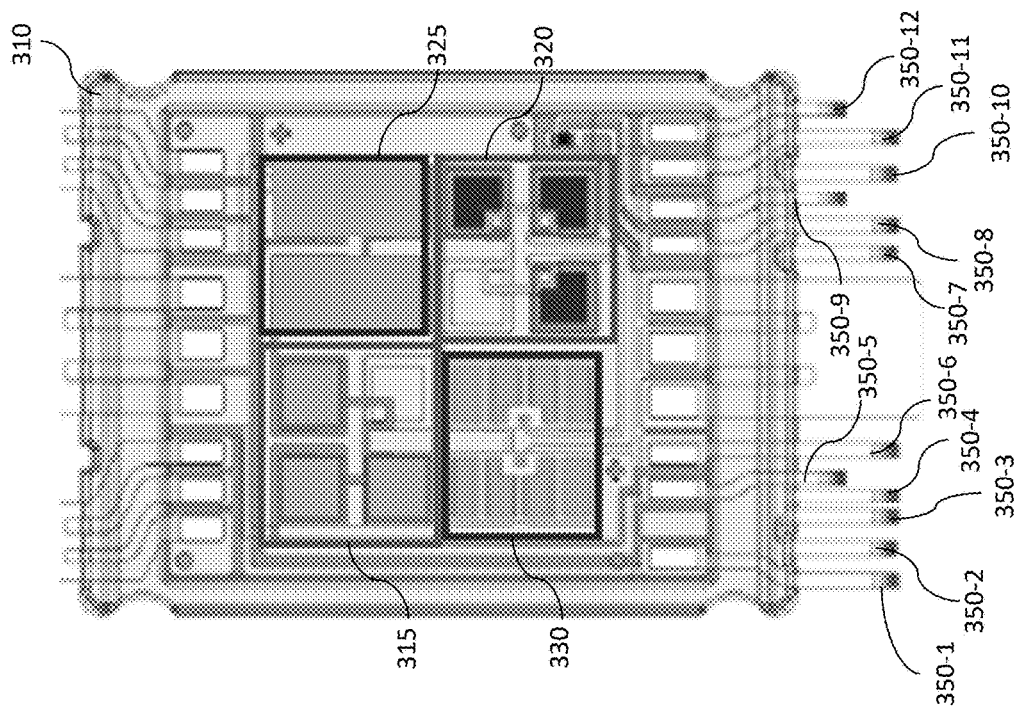
FIG. 3 is an illustration of a multi-chip power module, in accordance with the disclosure.

Referring to the drawings, the left most digit of a reference number identifies the drawing in which the reference number first appears (e.g., a reference number '310' indicates that the element so numbered is first labeled or first appears in FIG. 3). Additionally, elements which have the same reference number, followed by a different letter of the alphabet or other distinctive marking (e.g., an apostrophe), indicate elements which may be the same in structure, operation, or form but may be identified as being in different locations in space or recurring at different points in time (e.g., reference numbers "110a" and "110b" may indicate two different input devices which may be functionally the same, but may be located at different points in a simulation arena).

FIG. 1 is a graphical representation 100 of conduction losses of a semiconductor type, according to an embodiment of the present disclosure. An observed voltage drop over the device at a given current that is conducting through the device where the power dissipated in the device is the voltage times current. The lower the voltage drop at a given current, the more efficient the device.

For example, line 110 may represent the performance of an inverter using a silicon (Si) device such as a Si Mosfet, IGBT, RC-IGBT, etc. Line 120 may represent the performance of an inverter using a wide bandgap device, for example, SiC Mosfets/IGBT/RC IGBT, gallium nitride high electron mobility transistor (GaN HEMT), and series or cascaded devices, vertical gallium nitride (GaN), gallium oxide (GaO), etc.

FIG. 1 illustrates that wide bandgap devices may be more efficient at lower currents, in this example at currents of 0 through approximately 90 amps, while Si devices may be more efficient at higher currents, in this example at currents greater than approximately 90 amps. This disclosure, in a number of embodiments, is directed to the utilization of two or more different devices, for example Si and/or wide bandgap, that may be operated in parallel together or decoupled and operated independently. Such an approach may allow for the unique efficiency benefits of wide bandgap devices to be utilized in operating regions that may be more efficient under a pre-determined mission profile, and for the remainder of the operating region to be covered by another type of device, for example, Si. Such an approach may provide improved efficiency of the wide bandgap device to increase fuel economy of an electric vehicle relative to full Si based device usage.

Figure 2:
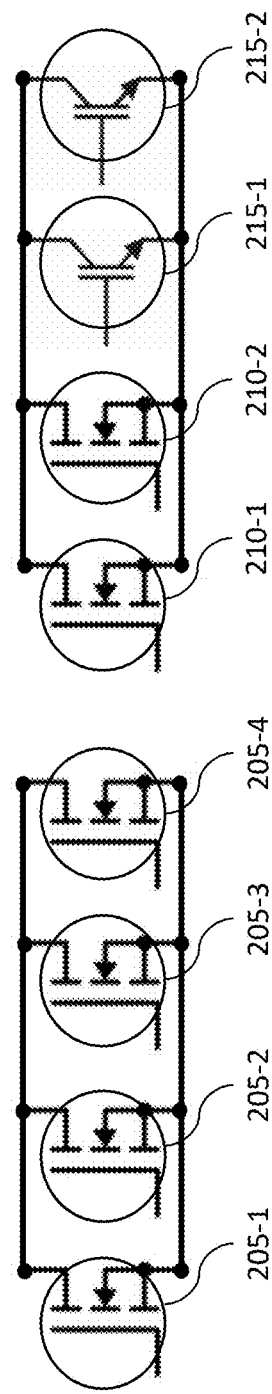
FIG. 2A is an illustration of a microchannel plate inverter, in accordance with the disclosure.
FIG. 2B is an illustration of an embodiment of a possible Mosfet and Si IGBT combination inverter, in accordance with the disclosure.

FIG. 2A also illustrates the concept of a single semiconductor inverter device with FIG. 2B illustrating the concept of a dual semiconductor inverter device type, according to an embodiment of the present disclosure. FIG. 2A may contain a single type of device, for example, multiple wide bandgap devices, such as SiC MOSFET devices 205-1, 205-2, 205-3, and 205-4. FIG. 2B illustrates two device types within a single multi-chip power module, for example a first device type, e.g., wide bandgap SiC MOSFET devices 210-1 and 210-2, and a second device type, e.g., Si type Si IGBT devices 215-1 and 215-2.

A multi-chip power module may include two or more dies of the same or different type that may be packaged within a single power module to form a discrete, half-bridge, or 6-pack configuration. In addition, a multi-chip power module may include two separate gate collector/drain, emitter/source pins per device type in which the power module could encompass two or four switches, also referred to as functional switches, in a half-bridge, or six or twelve switches in a 6-pack configuration. The functional switches may then drive the state of the device from on to off or from off to on.

FIG. 3 illustrates a multi-chip power module 300, according to an embodiment of the present disclosure. The multi-chip power module 300 may include a housing 310 that further includes multiple semiconductor devices which may also be of different device types. For example, device 315 and device 320 may be wide bandgap devices while device 325 and device 330 may be Si type devices. Device 315 and device 330 may also be referred to as "Low side" devices while device 320 and device 325 may be referred to as "High side" devices, as will be shown schematically in FIG. 4. Power module 300 may also include individual kelvin pins for each device type. For example, pins 350 may be connected to devices 315, 320, 325, and 330 as follows:

pin 350-1 may be connected to the gate of the Low wide bandgap device 315;
pin 350-2 may be connected to the source of the Low wide bandgap device 315;
pin 350-3 may be connected to the drain of the Low wide bandgap device 315;
pin 350-4 may be connected to the gate of the Low Si device 330;
pin 350-5 may be connected to the source/emitter of the Low Si device 330;
pin 350-6 may be connected to the drain/collector of the Low Si device 330;
pin 350-7 may be connected to the drain/collector of the High Si device 325;
pin 350-8 may be connected to the source/emitter of the High Si device 325;
pin 350-9 may be connected to the gate of the High Si device 325;
pin 350-10 may be connected to the drain of the High wide bandgap device 320;
pin 350-11 may be connected to the source of the High wide bandgap device 320; and
pin 350-12 may be connected to the gate of the High wide bandgap device 320.

Power module 300 may also be configured as a discrete, half-bridge, or 6-pack configuration where the paralleled unique semiconductor device type may be electrically connected or decoupled to form multiple functional switches that may be controlled independently.

Figure 4:
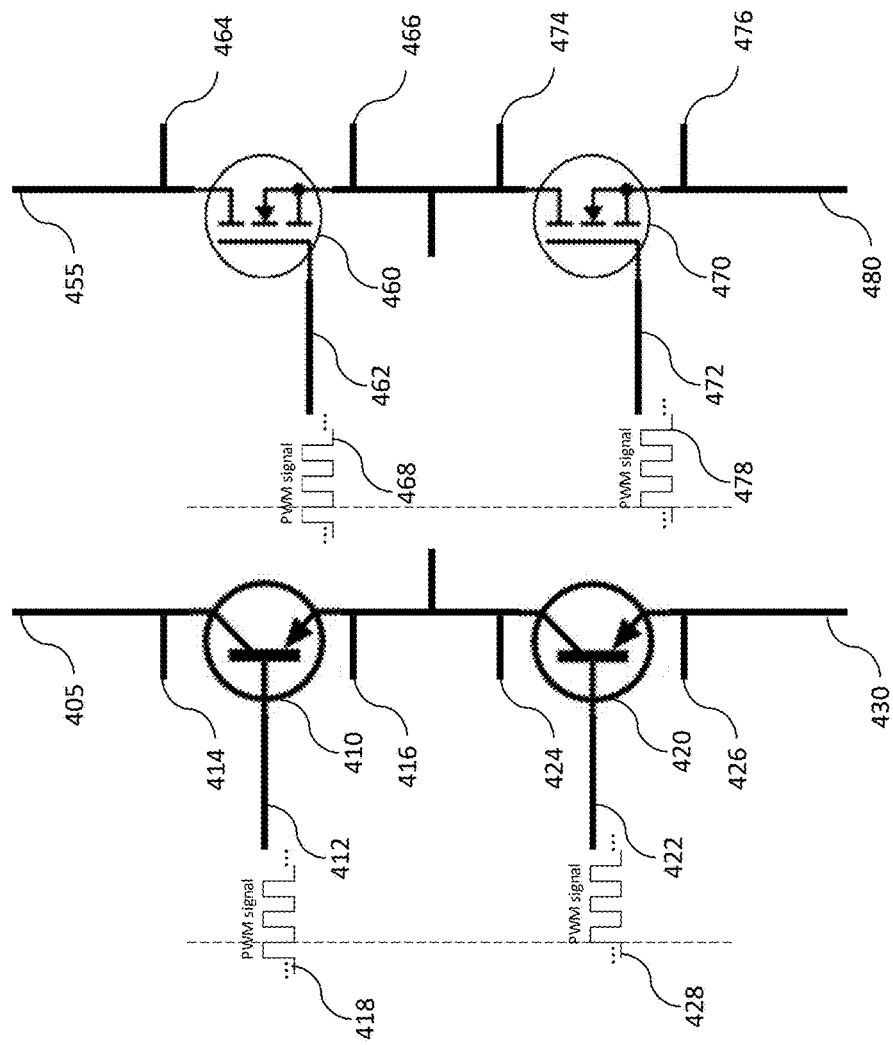
FIG. 4 is a schematic design of a multi-chip power module with example pulse width modulation input signals, in accordance with the disclosure.

FIG. 4 illustrates a schematic of a half-bridge power module 400, according to an embodiment of the present disclosure. Half-bridge power module 400 may include different types of devices, for example device 410 and device 420 may be Si type devices while device 460 and device 470 may be wide bandgap type devices. Further, device 410 may include a kelvin pin at collector High 414, a kelvin pin at gate High 412, a kelvin pin at emitter High 416. Device 420 may include a kelvin pin at collector Low 424, a kelvin pin at gate Low 422, a kelvin pin at emitter Low 426. Further, Si type device 410 may be connected to a positive high voltage direct current at pin 405 and a negative high voltage current at pin 430. Further, Si type device 410 may be driven by a signal 418 into gate High 412 and by a signal 428 into gate Low 422.

Wide bandgap device 460 may include a kelvin pin at drain High 464, a kelvin pin at gate High 462, a kelvin pin at source High 466. Device 470 may include a kelvin pin at drain Low 474, a kelvin pin at gate Low 472, a kelvin pin at source Low 476. Further, wide bandgap type device 460 may be connected to a positive high voltage direct current at pin 455 and where wide bandgap device 470 may be connected to a negative high voltage current at pin 480. Further, wide bandgap type device 460 may be driven by a signal 468 into gate High 462 and by a signal 478 into gate Low 472.

Using signals 418, 428, 468, and 478, devices 410, 420, 460, and 470 may be independently controlled. Devices 410, 420, 460, and 470 may also be referred to as independent semiconductor functional switches. In one embodiment, the half-bridge example shown in FIG. 4 may be driven as de-coupled and independently driven devices where, for example just wide bandgap devices 460 and 470 receive pulse width modulated signals 468 and 478, disabling Si devices 410 and 420. Or conversely, just Si devices 410 and 420 receive pulse width modulated signals 418 and 428, disabling wide bandgap devices 460 and 470.

In another embodiment, devices 410, 420, 460, and 470 may be driven in parallel as synchronized devices. In a parallel driven situation, both Si devices 410 and 420, and wide bandgap devices 460 and 470 receive pulse width modulated signals 418, 428, 468 and 478, respectively. In some embodiments signals 418 and 428 may be operated complementary together in their pulse wide modulated signals (same as 468 and 478 respectively). Where the offset may occur is between 418 and 468 (428 and 478 respectively as well) when the Si and wide bandgap devices are operated in parallel.

Such independent control through the use of gate signals 418, 428, 468, and 478 allow for driving just wide bandgap type devices, just Si type devices, or both types simultaneously. In addition, in some embodiments, Si and wide bandgap devices may have different turn on/off speeds and gate drive voltage parameters. Independent driving pins allow for different voltages, e.g., +15V/−7.5V for Si type devices and +18V/−5V for wide bandgap devices. Independent pins as described also allow for timing and pulse wide modulation width compensation to account for delays in gate voltages to synchronize turn on/off times for improved current sharing during transients.

There may be additional differences between Si type devices and wide bandgap devices. For example, wide bandgap devices may typically have much faster di/dts, e.g., change in current over change in time, different conduction characteristics, and lower short circuit robustness characteristics than those of an Si type device. The use of independent pins as described above for each device/switch in FIG. 4, e.g., device 410, 420, 460, and 470, may be used to configure and protect each device, which may allow for the unique configuration of desat threshold voltage, blanking time, and other short-circuit protection methods for each device type for independent input to the gates of each device, e.g., gate High 412, gate Low 422, gate High 462, and gate Low 472. The use of independent short circuit detection may also enable communication to a controller regarding which switch type may have incurred damage such that the other switch may be used.

While Si and wide bandgap devices may have different electrical characteristics, they may also exhibit different physical characteristics. For example, Si and wide bandgap devices may have different coefficients of thermal expansion that may include where a power module substate may include non-uniform layers and thicknesses of conductors and/or ceramics, selectively embedded vertical heat spreaders, embedded composite dielectrics, or a combination of these to accommodate different mechanical properties of different die attached materials and thicknesses. Other physical attribute differences that may require different physical substrate designs may also include different young's modulus, e.g., the measure of the ability of a material to withstand changes in length under lengthwise tension or compression.

FIGS. 5A, 5B, 5C, and 5D are illustrations of different possible examples of power module substrates and associated dies, according to embodiments of the present disclosure. For example, FIG. 5A illustrates a non-uniform thickness through a ceramic substrate 516 with a flat top conductor plane 514 and bottom conductor plane 518, with die type 510 and die type 512. FIG. 5B illustrates an uneven thickness top conductor 524 with a uniform ceramic plane 526 embedded between top conductor 524 and bottom conductor 528 with corresponding die type 520 and die type 522.

Si and wide bandgap devices may also have different heat flux densities, for example, wide bandgap devices may exhibit substantially higher watts loss/mm$^2$ than that of an Si device. Further, a smaller die area of a wide bandgap device die may lead to a higher thermal resistance with purely vertical heat flow. One possible method of compensation may include the use of thermal pyrolytic graphite (TPG) and alloys such as CuMo/CuW that include enhanced heat spreading properties that may be used to lower overall thermal resistance where TPG may be embedded within electrically conductive layers. FIG. 5C illustrates a non-uniform thickness through a ceramic substrate 536 between a flat top conductor plane 534 and a bottom conductor plane 538 in which die type 532 utilizes a metal alloy heat spreader 539. Also notice that in some embodiments, die type 532 may include a slimmer configuration than that of die type 530. FIG. 5D illustrates an uneven thickness top conductor 544 and a uniform bottom conductor 548, with a heat spreader 549, e.g., TPG, that may be embedded within a uniform plane of ceramic substrate 546 and ceramic substrate 547, which may support die type 540 and die type 542.

Further, the substrates shown in FIGS. 5A, 5B, 5C, and 5D may also include a composite dielectric layer, for example, including ceramics, polymers, etc., for electrical isolation in place of just ceramics to provide potential additional flexibility to compensate for thermal expansion and elasticity characteristics of semiconductor types within the power module.

Figure 6:
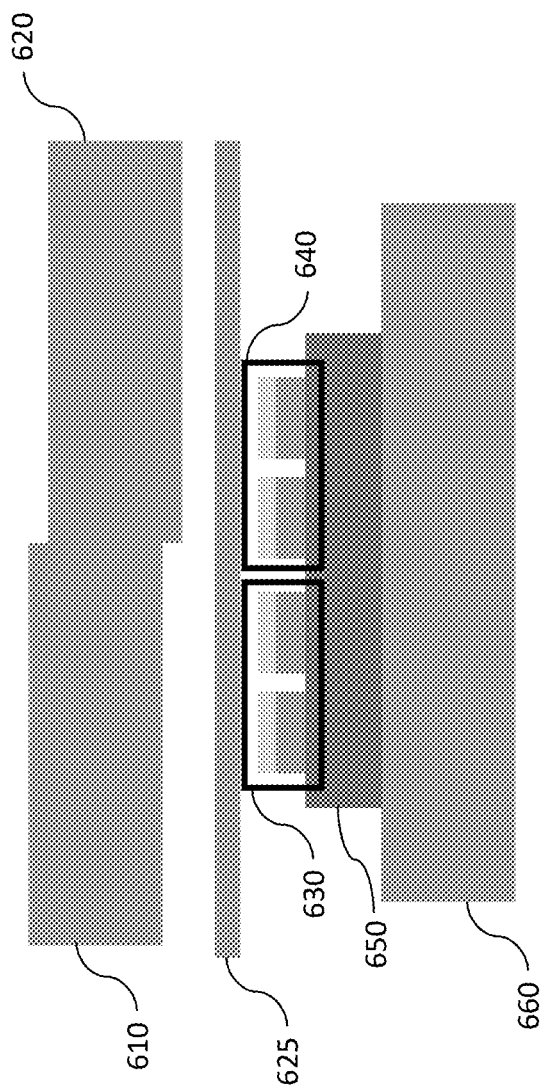
FIG. 6 is an illustration of a power module sintering process with multiple zones, in accordance with the disclosure.

FIG. 6 is an illustration of a power module sintering process 600 with multiple zones, according to an embodiment of the present disclosure. For example, a power module sintering process may include splitting a sintering plate into multiple zones, e.g., sintering plate 610 and sintering plate 620 that may be uniquely defined for different sintering parameters for multiple different die types that may be attached in a single step. Multiple zone sintering plates may allow for an optimized sintering profile and condition for each device type while minimizing the number of steps needed for the die attaching process. Sintering process 600 may also include the use of a Teflon sheet 625, combination Si and wide bandgap dies 630 and combination Si and wide bandgap dies 640, placed upon a sintering jig 650, or a substrate, and may also include a bottom heating plate 660.

Figure 7B:
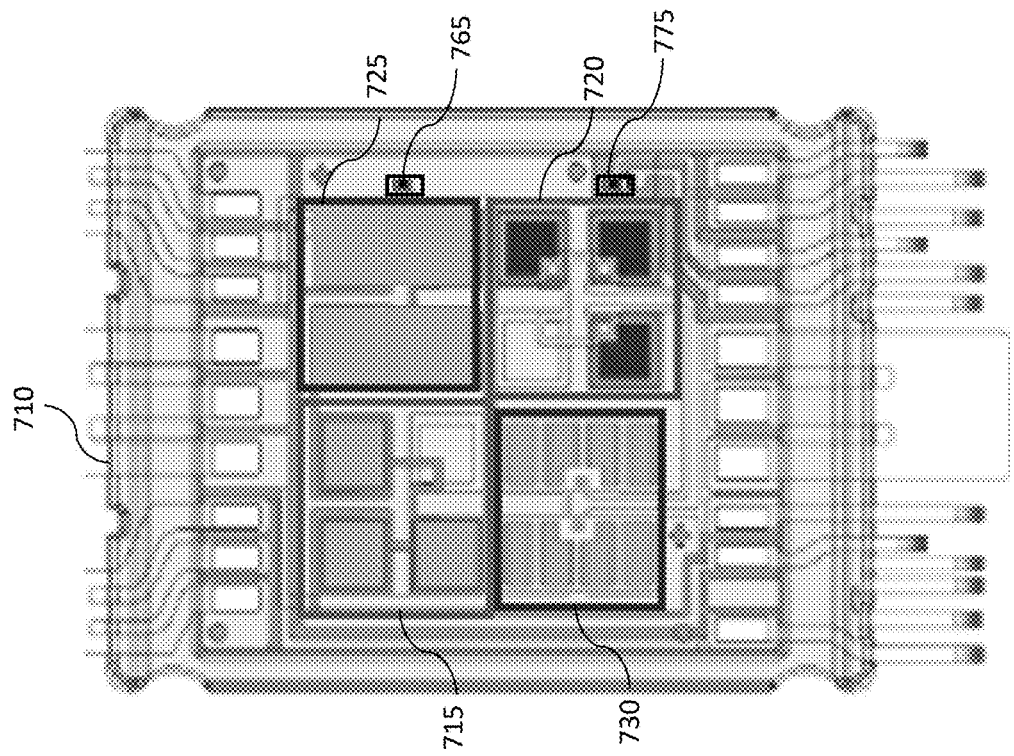
FIGS. 7A and 7B are illustrations of multi-chip power modules with temperature sensors, in accordance with the disclosure.
Figure 7A:
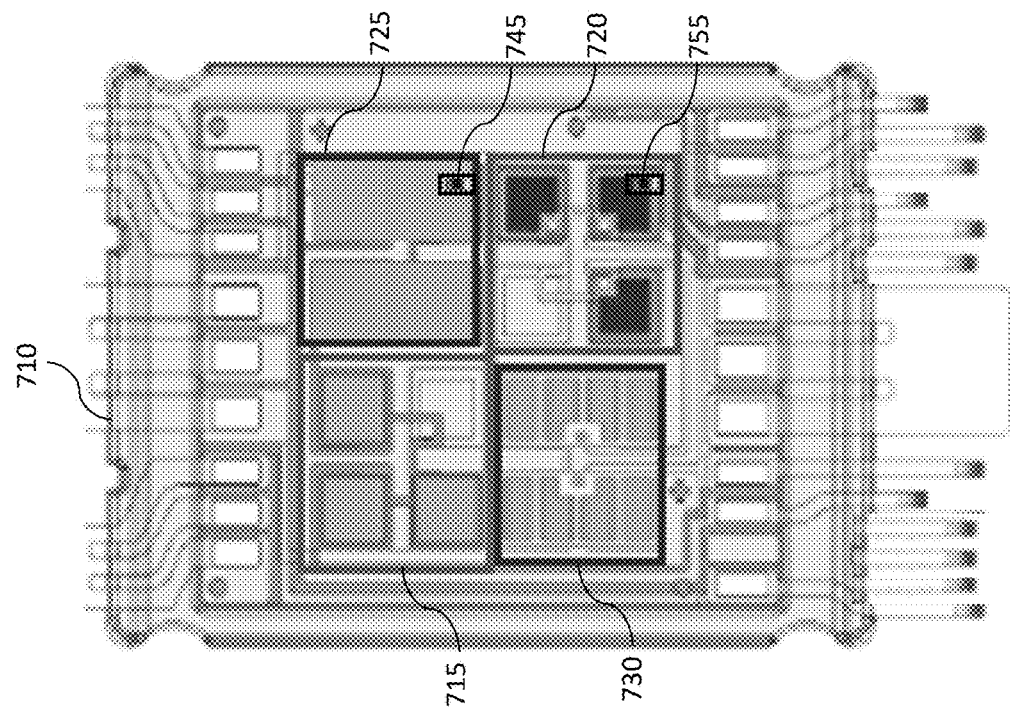

FIGS. 7A and 7B are illustrations of multi-chip power modules with temperature sensors, according to embodiments of the present disclosure. Multi-chip power module 710 may include device 715, device 720, device 725, and device 730. In one embodiment, device 715 and device 720 may be wide bandgap devices, and device 725 and device 730 may be Si devices. However, due to non-uniform current density/sharing and unique thermal conductivities of each die type may result in different temperature rise and fall rates over the ambient temperature. Thus, each device type may need unique temperature monitoring. FIG. 7A therefore, may also include an on-die temperature monitor 745 and on-die temperature monitor 755. In this embodiment, on-die temperature monitor 745 may be mounted on Si device 725 while on-die temperature monitor 755 may be mounted on wide bandgap device 720. FIG. 7B is an illustration of device type thermistor 765 and device type thermistor 775 where is this embodiment, device type thermistor 765 may be focused on Si type device and device type thermistor 775 may be focused on wide bandgap type device, but not necessarily mounted on the specific die.

In addition to electrical and physical characteristic differences already discussed, the use of multiple device types in a power module may also produce undesirable inductances that may adversely affect each device. For example, wide bandgap devices may utilize faster switching than a Si device, which may further stress the importance of optimized loop inductances to minimize ringing and overshooting that may lead to voltage and current stress. Thus, in a hybrid switch multi-chip power module, a wide bandgap device may need to be prioritized in having an optimized loop inductance while a Si based device may not need the same design criteria.

Figure 8A:
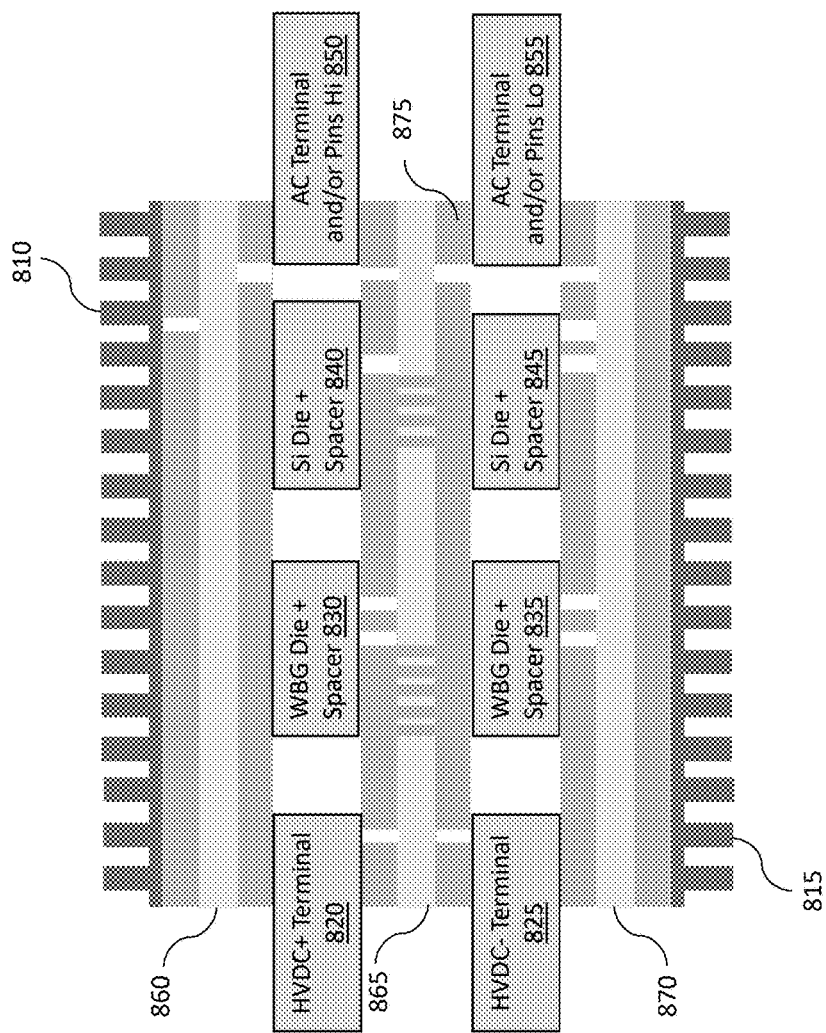
FIG. 8A is an illustration of a sandwiched, cooled multi-chip power module, in accordance with the disclosure.

FIG. 8A illustrates a sandwiched single sided cooled multi-chip power module design 800 utilizing three substrate/printed circuit board layers, e.g., substrate 860, substrate 865, and substrate 870, according to an embodiment of the present disclosure. Substrate 865 may also utilize vias or solid conductors without ceramic to make vertical connections between the layers to stack various kinds of semiconductor dies on top of each other within the same package to form a half bridge connection. The multi-chip power module design 800 also illustrates the use of cooling fins 810 and 815. Thus, current may flow through multiple or user selected dies in parallel within each packaged function switch. Multi-chip power module design 800 may also include a high voltage direct current positive terminal 820, a wide bandgap die and spacer 830, a Si die and spacer 840, and an alternating current terminal and/or pins High 850. Multi-chip power module design 800 may also include a high voltage direct current negative terminal 825, a wide bandgap die and spacer 835, a Si die and spacer 845, and an alternating current terminal and/or pins Low 855.

Figure 8B:
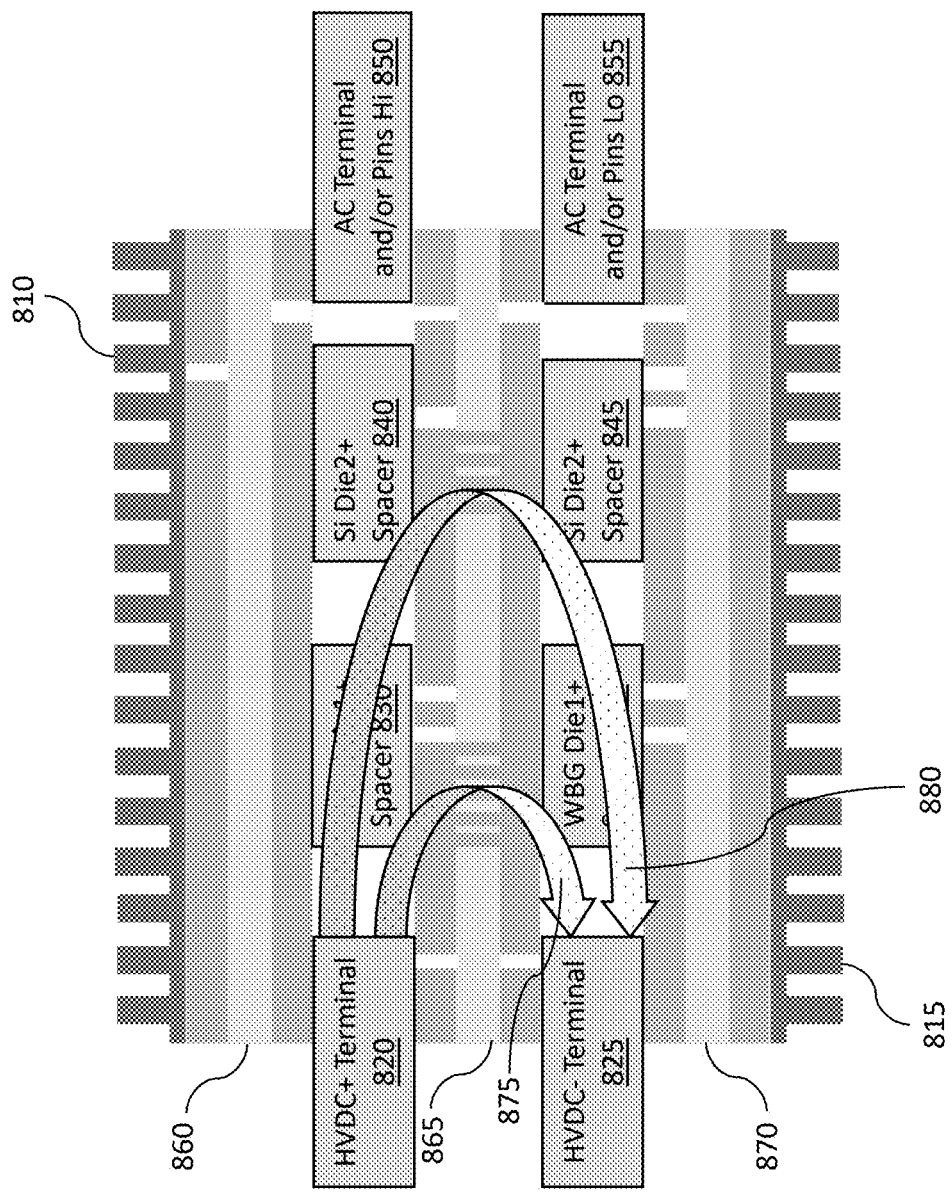
FIG. 8B is an illustration of a sandwiched, cooled multi-chip power module with highlighted optimized loop inductance, in accordance with the disclosure.

FIG. 8B illustrates the sandwiched single sided cooled multi-chip power module design 800 overlayed with two inductance loop illustrations, according to an embodiment of the present disclosure. FIG. 8B illustrates a layout design to optimize loop inductance for the wide bandgap devices, through loop 875 while also providing low inductance for the Si devices as shown by loop 880.

Figures 9A, 9B:
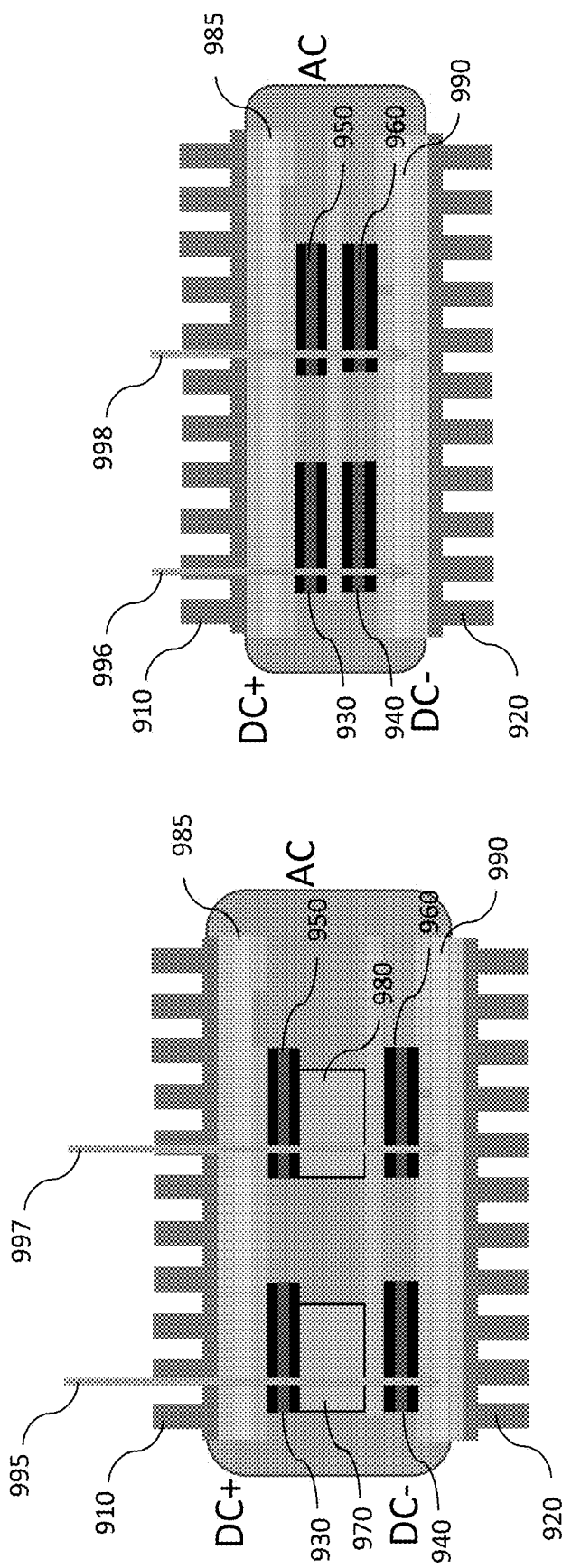
FIGS. 9A and 9B are illustrations of multi-chip dual substrate power modules, in accordance with the disclosure.

FIGS. 9A and 9B illustrate double sided cooled, multi-chip power module using two or less substrates, according to an embodiment of the present disclosure. FIG. 9A illustrates a double sided cooled, multi-chip power module including a substrate 985 and a substrate 990, an upper cooling fin 910, a lower cooling fin 920. Leg 995 illustrates a wide bandgap leg that may include high side die 930 and low side die 940, with a spacer 970. Leg 997 illustrates a Si leg that may include high side die 950 and low side die 960, with a spacer 980. FIG. 9B illustrates a double sided cooled, multi-chip power module including a substrate 985 and a substrate 990, an upper cooling fin 910, a lower cooling fin 920. Leg 996 illustrates a wide bandgap leg that may include high side die 930 and low side die 940, without a spacer. Leg 998 illustrates a Si leg that may include high side die 950 and low side die 960, without a spacer.

Figure 10:
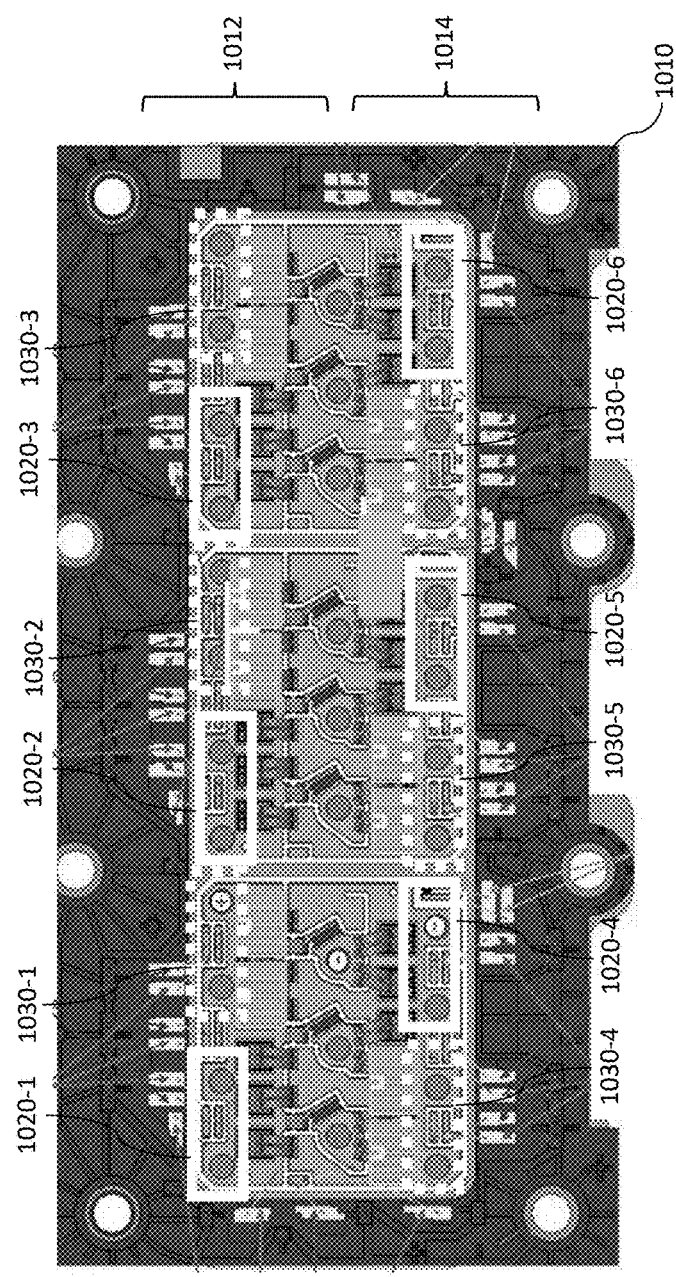
FIG. 10 is an illustration of a power module with integrated resistive capacitive snubbers, in accordance with the disclosure.

FIG. 10 illustrates a power module system board 1000 with integrated resistive capacitive snubbers, according to an embodiment of the present disclosure. As previously discussed, switching characteristics are different between wide bandgap switching devices and Si devices. Different switching characteristics between Si and wide bandgap devices may lead to uneven current sharing during a turn on and turn off state of a device. Therefore, a delay may be implemented utilizing a restive-capacitive (RC) snubber across the drain-source connection of each device type to shift the turn on and turn off of two device types to achieve even current sharing. In addition, each device type may also have its own unique RC snubber design to align the switching transient as needed. Such an implementation is shown in FIG. 10 with power module 1010 may include snubber capacitors 1020-1, 1020-2, and 1020-3 on the high side 1012 of power module 1010 for wide bandgap devices. Power module 1000 that may also include snubber capacitors 1020-4, 1020-5, and 1020-6 on the low side 1014 of power module 1010 for wide bandgap devices. Power module 1000 that may also include snubber capacitors 1030-1, 1030-2, and 1030-3 on the high side 1012 of power module 1010 for Si devices. Power module 1000 that may also include snubber capacitors 1030-4, 1030-5, and 1030-6 on the low side 1014 of power module 1010 for Si devices.

Figure 11:
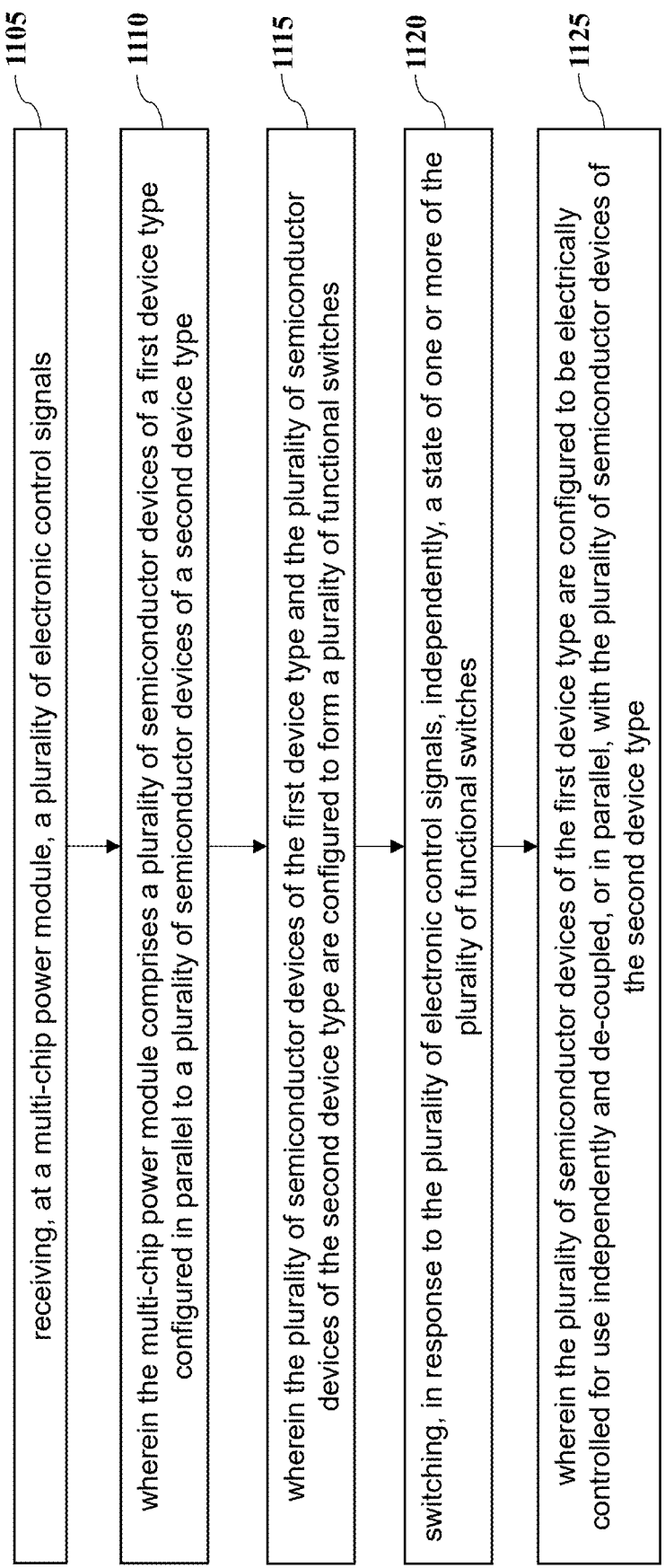
FIG. 11 is a flowchart of a method for controlling a vehicle power inverter, in accordance with the disclosure.

FIG. 11 is a flowchart 1100 that illustrates a method for controlling a power inverter in a vehicle, according to an embodiment of the present disclosure. Flowchart 1100 may begin at step 1105 by receiving, at a multi-chip power module, a plurality of electronic control signals. As discussed above regarding FIG. 4, the half-bridge power module 400 may include in this embodiment, four devices. Here the four devices include two Si devices, i.e., device 410 and device 420, and two wide bandgap devices, i.e., device 460 and device 470. Each device includes a gate that may receive an electronic control signal that are labeled signal 418, signal 428, signal 468, and signal 478. Each of these signals may change the state of each device, for example switching the device on or conversely switching the device off. Thus, the half-bridge power module 400 may function as an inverter and convert direct current to alternating current.

At step 1110, the method may specify that the multi-chip power module may include a plurality of semiconductor devices of a first device type configured in parallel to a plurality of semiconductor devices of a second device type. Again, as discussed in FIG. 4, but also shown in FIGS. 3, 7A, 7B, 8A, and 8B, the multi-chip power module may include multiple semiconductor devices of a first type and a second type. For example, FIG. 4 illustrates Si semiconductors as device 410 and device 420, and wide bandgap semiconductors as device 460 and 470. Furthermore, the Si devices 410 and 420 are electrically configured to operate in parallel to the wide bandgap devices 460 and 470.

At step 1115, the method may also include where the plurality of semiconductor devices of the first device type and the plurality of semiconductor devices of the second device type are configured to form a plurality of functional switches. As discussed in FIG. 4, devices 410, 420, 460, and 470 may also be referred to as independent semiconductor functional switches. Further, as each device may be driven independently, each functional switch may be driven as decoupled. In such a scenario, for example, just wide bandgap devices 460 and 470 may receive a pulse width modulated signal 468 and 478, disabling Si devices 410 and 420. Or conversely, just Si devices 410 and 420 receive a pulse width modulated signals 418 and 428, disabling wide bandgap devices 460 and 470.

At step 1120, the method may continue by switching, in response to the plurality of electronic control signals, independently, a state of one or more of the plurality of functional switches. As shown in FIG. 4, by using signals 418, 428, 468, and 478, devices 410, 420, 460, and 470 may be independently controlled. Further, a multi-chip power module may include two separate gate collector/drain, emitter/source pins per device type in which the power module could encompass four or two switches, also referred to as functional switches, in a half-bridge, or six or twelve switches in a 6-pack configuration where the functional switches may then drive the state of the device from on to off or from off to on.

At step 1125, the method may continue where the plurality of semiconductor devices of the first device type are configured to be electrically controlled for use independently and de-coupled, or in parallel, with the plurality of semiconductor devices of the second device type. As discussed in FIG. 4, semiconductor devices of the first type, e.g., Si devices 410 and 420, may be decoupled from wide bandgap devices 460 and 470. Such a decoupling may be achieved by just providing signals, such as pulse width modulated signals, to the gates of devices 410 and 420. In a similar manner, wide bandgap devices 460 and 470 may be decoupled from Si devices 410 and 420. Such a decoupling may be achieved by just providing signals, such as pulse width modulated signals, to the gates of devices 460 and 470.

Further, by providing signals to the gates of both the Si and wide bandgap devices as illustrated in FIG. 4, the Si and wide bandgap devices may be driven in parallel. As discussed, Si and wide bandgap devices may have different turn on/off speeds and gate drive voltage parameters. Independent driving pins allow for different voltages, e.g., +15V/−7.5V for Si type devices and +18V/−5V for wide bandgap devices. Independent pins as described above also allow for gate signal timing or different pulse widths for Si and wide bandgap device compensation to account for delays in gate voltages to synchronize turn on/off time for improved current sharing during transients. Thus, while the Si and wide bandgap devices may be driven in parallel and synchronously, the drive signals to each type of device may not be identical.

Method flowchart 1100 may then end.

The description and abstract sections may set forth one or more embodiments of the present disclosure as contemplated by the inventor(s), and thus, are not intended to limit the present disclosure and the appended claims.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof may be appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present disclosure should not be limited by the above-described exemplary embodiments.

Exemplary embodiments of the present disclosure have been presented. The disclosure is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the disclosure.

What is claimed is:

1. A system for controlling a power inverter in a vehicle comprising:
 a single multi-chip power module comprising:
  one or more semiconductor devices of a first device type; and
  one or more semiconductor devices of a second device type;
  wherein the one or more semiconductor devices of the first device type and the one or more semiconductor devices of the second device type are configured in parallel
  wherein the one or more semiconductor devices of the first device type and the one or more semiconductor devices of the second device type are configured to form a plurality of functional switches, in which each of the plurality of functional switches are under independent electrical control; and
  wherein the one or more semiconductor devices of the first device type are configured to be electrically controlled for use independently and de-coupled, or in parallel, with the one or more semiconductor devices of the second device type.

2. The system of claim 1, wherein the first device type comprises a silicon type device and the second device type comprises a wide bandgap (WBG) device.

3. The system of claim 2, wherein the silicon type device comprises a silicon (Si) metal-oxide-semiconductor field-effect transistor (MOSFET), an insulated-gate bipolar transistor (IGBT), or a reverse-current IGBT.

4. The system of claim 2, wherein the WBG device comprises a silicon carbide (SiC) metal-oxide-semiconductor field-effect transistor (MOSFET), an insulated-gate bipolar transistor (IGBT), a reverse-current IGBT, a SiC junction field effect transistor (JFET), or a gallium nitride semiconductor.

5. The system of claim 1, wherein the one or more semiconductor devices of the first device type and the one or more semiconductor devices of the second device type comprise a half-bridge configuration.

6. The system of claim 1, wherein the first device type comprises a first type of a wide bandgap (WBG) device and the second device type comprises a second type of a WBG device.

7. The system of claim 1, wherein the one or more semiconductor devices of the first device type and the one or more semiconductor devices of the second device type comprise a six-pack module configuration.

8. The system of claim 7, wherein the six-pack module configuration comprises independent semiconductor functional switches.

9. The system of claim 1, wherein each of the plurality of functional switches under independent control are configured to be each driven by a pulse width modulated signal.

10. The system of claim 1, further comprising two independent separate gate collector/drain, emitter/source pins for the first device type and two independent separate gate collector/drain, emitter/source pins for the second device type.

11. The system of claim 10, wherein the two independent separate gate collector/drain, emitter/source pins for the first device type are configured for a first applied voltage that is different from a second applied voltage to the two independent separate gate collector/drain, emitter/source pins for the second device type.

12. The system of claim 1, wherein the first device type and the second device type are formed on a same power module substrate.

13. A method for controlling a power inverter in a vehicle comprising:
receiving, at a multi-chip power module, a plurality of electronic control signals, wherein the multi-chip power module comprises one or more semiconductor devices of a first device type configured in parallel to one or more semiconductor devices of a second device type, wherein the one or more semiconductor devices of the first device type and the one or more semiconductor devices of the second device type are configured to form a plurality of functional switches; and
switching, in response to the plurality of electronic control signals, independently, a state of one or more of the plurality of functional switches, wherein the one or more semiconductor devices of the first device type are configured to be electrically controlled for use independently and de-coupled, or in parallel, with the one or more semiconductor devices of the second device type.

14. The method of claim 13, wherein the first device type comprises a first type of a wide bandgap (WBG) device and the second device type comprises a second type of a WBG device.

15. The method of claim 13, wherein the one or more semiconductor devices of the first device type and the one or more semiconductor devices of the second device type comprise a half-bridge configuration.

16. The method of claim 13, wherein the plurality of electronic control signals comprise one or more pulse width modulated signals.

17. The method of claim 13, wherein the first device type further comprises two independent separate gate collector/drain, emitter/source pins and the second device type further comprise two independent separate gate collector/drain, emitter/source pins.

18. The method of claim 17, further comprising applying a first voltage to the two independent separate gate emitter/source pins for the first device type and applying a second voltage to the two independent separate gate emitter/source pins for the second device type.

19. The method of claim 13, further comprising forming the first device type and the second device type on a same power module substrate.

20. A system for controlling a power inverter in a vehicle comprising:
a single multi-chip power module comprising:
one or more semiconductor devices of a first device type, wherein the first device type comprises a silicon type device, and wherein the silicon type device comprises a silicon (Si) metal-oxide-semiconductor field-effect transistor (MOSFET), an insulated-gate bipolar transistor (IGBT), a reverse-current IGBT, or a junction field effect transistor (JFET);
one or more semiconductor devices of a second device type wherein the second device type comprises a wide bandgap (WBG) device, and wherein the WBG device comprises a silicon carbide (SiC) metal-oxide-semiconductor field-effect transistor (MOSFET), an insulated-gate bipolar transistor (IGBT), a reverse-current IGBT, a JFET, or a gallium nitride semiconductor; and
two independent separate gate collector/drain, emitter/source pins for the first device type and two independent separate gate collector/drain, emitter/source pins for the second device type, wherein the two independent separate gate collector/drain, emitter/source pins for the first device type are configured for a first applied voltage that is different from a second applied voltage to the two independent separate gate collector/drain, emitter/source pins for the second device type;
wherein the one or more semiconductor devices of the first device type and the one or more semiconductor devices of the second device type are configured in parallel;
wherein the one or more semiconductor devices of the first device type and the one or more semiconductor devices of the second device type are configured to form a plurality of functional switches, in which each of the plurality of functional switches are under independent electrical control;
wherein the one or more semiconductor devices of the first device type are configured to be electrically controlled for use independently and de-coupled, or in parallel and synchronously, with the one or more semiconductor devices of the second device type; and
wherein the first device type and the second device type are formed on a same power module substrate.

* * * * *